(12) United States Patent
Hatakeyama et al.

(10) Patent No.: US 9,798,242 B2
(45) Date of Patent: *Oct. 24, 2017

(54) RINSE SOLUTION FOR PATTERN FORMATION AND PATTERN FORMING PROCESS

(71) Applicant: Shin-Etsu Chemical Co., Ltd., Tokyo (JP)

(72) Inventors: Jun Hatakeyama, Joetsu (JP); Daisuke Kori, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/952,539

(22) Filed: Nov. 25, 2015

(65) Prior Publication Data

US 2016/0154312 A1    Jun. 2, 2016

(30) Foreign Application Priority Data

Nov. 27, 2014 (JP) .................................. 2014-239498

(51) Int. Cl.
*G03F 7/40*   (2006.01)
*G03F 7/039*  (2006.01)
*G03F 7/20*   (2006.01)
*G03F 7/11*   (2006.01)
*G03F 7/32*   (2006.01)

(52) U.S. Cl.
CPC .............. *G03F 7/40* (2013.01); *G03F 7/0397* (2013.01); *G03F 7/11* (2013.01); *G03F 7/2053* (2013.01); *G03F 7/2059* (2013.01); *G03F 7/325* (2013.01); *G03F 7/405* (2013.01)

(58) Field of Classification Search
None
See application file for complete search history.

(56) References Cited

U.S. PATENT DOCUMENTS

| 8,034,547 | B2 | 10/2011 | Tsubaki et al. |
| 8,227,183 | B2 | 7/2012 | Tsubaki et al. |
| 8,241,840 | B2 | 8/2012 | Tsubaki et al. |
| 2005/0227151 | A1* | 10/2005 | Hata .................. G03F 7/40 430/5 |

(Continued)

FOREIGN PATENT DOCUMENTS

| GB | 1073462 | * | 6/1967 |
| JP | 2008-281974 A | | 11/2008 |

(Continued)

OTHER PUBLICATIONS

Felix et al ("Acid-Labile, Chain-Scission Polymer Systems Used as Positive-Tone Photoresists Developable in Supercritical CO2", Chemistry of Materials, 2008, 20(9), p. 2932-2936).*

(Continued)

*Primary Examiner* — Sin Lee
(74) *Attorney, Agent, or Firm* — Westerman, Hattori, Daniels & Adrian, LLP

(57) ABSTRACT

In a resist pattern forming process, a rinse solution comprising (A) a heat/acid-decomposable polymer and (B) an organic solvent is effective. The pattern forming process using the rinse solution is successful in forming fine feature size patterns while minimizing the occurrence of pattern collapse.

10 Claims, 1 Drawing Sheet

APPLICATION OF PHOTORESIST

RESIST EXPOSURE

(56) References Cited

U.S. PATENT DOCUMENTS

| | | | | |
|---|---|---|---|---|
| 2011/0073847 A1* | 3/2011 | Kobayashi | ............ | H01L 51/003 257/40 |
| 2011/0177462 A1* | 7/2011 | Hatakeyama | ......... | G03F 7/0397 430/325 |
| 2015/0221500 A1* | 8/2015 | Ogihara | ............ | H01L 21/02068 134/19 |

FOREIGN PATENT DOCUMENTS

| | | |
|---|---|---|
| JP | 2008-281975 A | 11/2008 |
| JP | 4554665 B2 | 9/2010 |

OTHER PUBLICATIONS

Spring et al ("Carbon Nanotube Adsorptive Materials Derived from Acid Degradable Poly(acetals)", Macromolecules, 2014, 47 p. 2556-2560).*

* cited by examiner

FIG.1(A) APPLICATION OF PHOTORESIST
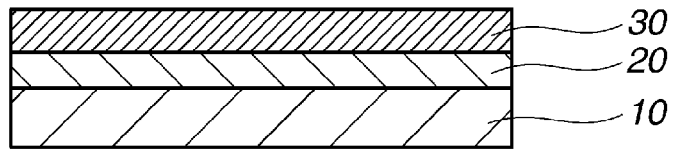
FIG.1(B) RESIST EXPOSURE
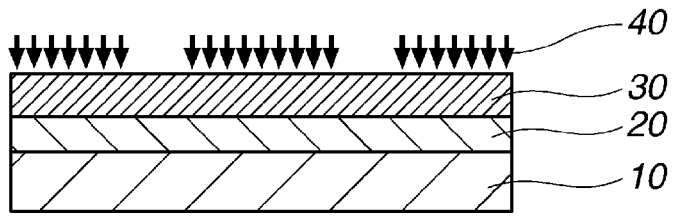
FIG.1(C) ORGANIC SOLVENT DEVELOPMENT
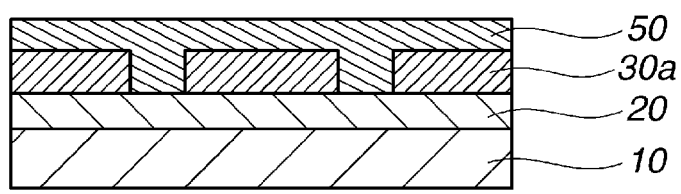
FIG.1(D) APPLICATION OF RINSE SOLUTION
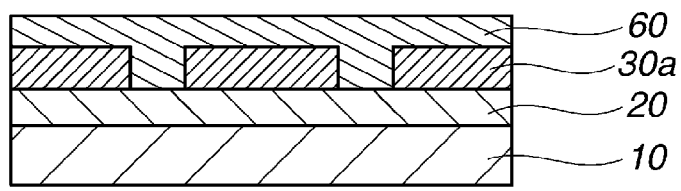
FIG.1(E) DECOMPOSITION OF RINSE SOLUTION POLYMER
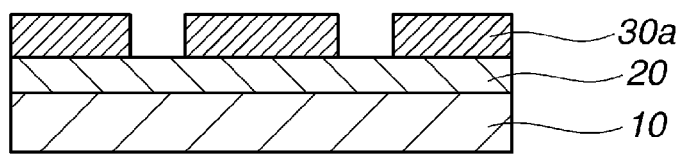
FIG.1(F) DRY ETCHING
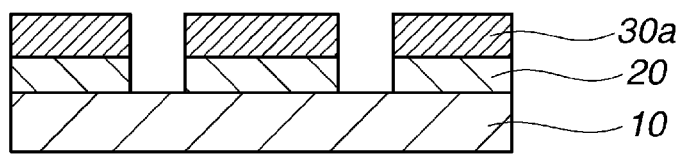

RINSE SOLUTION FOR PATTERN FORMATION AND PATTERN FORMING PROCESS

CROSS-REFERENCE TO RELATED APPLICATION

This non-provisional application claims priority under 35 U.S.C. §119(a) on Patent Application No. 2014-239498 filed in Japan on Nov. 27, 2014, the entire contents of which are hereby incorporated by reference.

TECHNICAL FIELD

This invention relates to a pattern forming process and a rinse solution therefor.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized edge roughness (LER, LWR) of resist film, defect-free MoSi laminate mask, reduced aberration of reflection mirror, and the like.

Another candidate for the 32-nm node lithography is high refractive index liquid immersion lithography. The development of this technology was stopped because LuAG, a high refractive index lens candidate had a low transmittance and the refractive index of liquid did not reach the goal of 1.8.

Under the circumstances, measures for prolonging the ArF immersion lithography were sought. One candidate measure is double patterning. Typical of the double patterning are the self-aligned double patterning (SADP) process of adding film to opposite side walls of lines of a resist pattern and the litho-etch-litho-etch (LELE) process of processing a substrate on every patterning. The SADP process is applied to simple line patterns whereas the LELE process is applied to complex patterns and hole patterns. A combination of SADP with LELE is also contemplated.

Recently a highlight is put on the organic solvent development. A very fine hole pattern, which is not achievable with the positive tone, is resolvable through negative tone development with organic solvent. As the ArF resist composition for negative tone development with organic solvent, positive ArF resist compositions of the prior art design may be used. Such pattern forming processes are described in Patent Documents 1 to 3.

In an attempt to form a line pattern of negative tone by organic solvent development, pattern collapse is a problem. When a line-and-space pattern of positive tone is formed via alkaline development, pattern collapse can occur if the pattern has a high aspect ratio. In contrast, the line pattern of negative tone takes an inversely tapered profile due to absorption of the resist, so that greater stresses are applied to the pattern top during spin drying after rinsing. For this reason, the negative tone pattern is more likely to collapse. It is desired to have a negative tone pattern forming process capable of preventing pattern collapse and a material used therein.

CITATION LIST

Patent Document 1: JP-A 2008-281974
Patent Document 2: JP-A 2008-281975
Patent Document 3: JP 4554665

SUMMARY OF INVENTION

An object of the invention is to provide a pattern forming process capable of forming fine patterns while minimizing the occurrence of pattern collapse after development.

The inventors have found that a solution of a heat/acid-decomposable polymer is effective as the rinse solution used to clean off the developer which has been applied after exposure. The polymer solution is applied to a resist pattern so that spaces between resist pattern features are filled with the polymer, and the polymer is then eliminated by heating. The resist pattern is cleaned without the risk of twist or collapse.

In one aspect, the invention provides a rinse solution for pattern formation comprising (A) a heat/acid-decomposable polymer and (B) an organic solvent.

In a preferred embodiment, the heat/acid-decomposable polymer comprises recurring units having the formula (1) or (2).

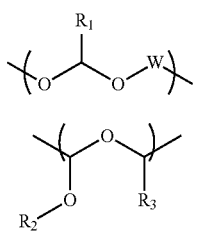

(1)

(2)

Herein $R^1$, $R^2$, and $R^3$ are each independently hydrogen or an optionally substituted, $C_1$-$C_{30}$ saturated or unsaturated, monovalent organic group, and W is a $C_2$-$C_{30}$ saturated or unsaturated, divalent organic group.

In a preferred embodiment, the organic solvent (B) is at least one solvent selected from the group consisting of $C_7$-$C_{10}$ ketone, $C_6$-$C_{12}$ ester, $C_7$-$C_{14}$ aldehyde, $C_6$-$C_{12}$ alkane, $C_6$-$C_{12}$ alkene, $C_6$-$C_{12}$ alkyne, $C_3$-$C_{10}$ alcohol, $C_8$-$C_{12}$ ether, and aromatic solvents.

More preferably, the organic solvent (B) is at least one solvent selected from among 2-octanone, 2-nonanone, 2-decanone, 2-heptanone, 3-heptanone, 4-heptanone, 2-hexanone, 3-hexanone, diisobutyl ketone, methylcyclohexanone, acetophenone, methylacetophenone, butyl acetate, isobutyl acetate, amyl acetate, isoamyl acetate, butenyl acetate, 2-methylbutyl acetate, 3-methylbutyl acetate, ethyl caproate, hexyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, isopropyl 2-methylbutyrate, isoamyl 3-methylbutyrate, ethyl 2-methylvalerate, ethyl 2-methylpentanoate, propyl 2-methylpentanoate, butyl 2-methylpentanoate, allyl heptanoate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, hexane, heptane, octane, nonane, decane, undecane, dodecane, methylcyclopentane, dimethylcyclopentane, cyclohexane, methylcyclohexane, dimethylcyclohexane, cycloheptane, cyclooctane, cyclononane, hexene, heptene, octene, cyclohexene, methylcyclohexene, dimethylcyclohexene, cycloheptene, cyclooctene, hexyne, heptyne, octyne, n-propyl alcohol, isopropyl alcohol, 1-butyl alcohol, 2-butyl alcohol, isobutyl alcohol, t-butyl alcohol, 1-pentanol, 2-pentanol, 3-pentanol, t-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, di-n-butyl ether, diisobutyl ether, di-s-butyl ether, di-n-pentyl ether, diisopentyl ether, di-s-pentyl ether, di-t-amyl ether, di-n-hexyl ether, toluene, xylene, ethylbenzene, isopropylbenzene, t-butylbenzene, mesitylene, and anisole.

In a preferred embodiment, the rinse solution may further comprise a thermal acid generator. More preferably, the thermal acid generator is an ammonium or sulfonium salt of an organic acid selected from sulfonic acid, carboxylic acid and imidic acid, a sulfonic acid ester, or a pyridinium salt having the following formula:

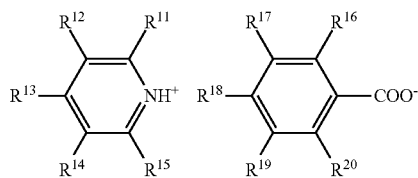

wherein $R^{11}$ to $R^{20}$ are each independently hydrogen, halogen, cyano, amino, a straight, branched or cyclic $C_1$-$C_{20}$ alkyl group, or $C_6$-$C_{20}$ aryl group.

In a preferred embodiment, the rinse solution may further comprise a basic compound.

In another aspect, the invention provides a pattern forming process comprising the steps of (1) forming a resist film on a substrate, the resist film comprising a resin having a solubility in a developer that changes under the action of acid, (2) exposing the resist film and baking, (3) developing the exposed resist film in an organic solvent developer, (4) replacing the developer by the rinse solution defined above, and (5) heating the solution on the resist film to decompose and eliminate the heat/acid-decomposable polymer.

In a preferred embodiment, the developer consists of at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, 2-methylbutyl acetate, 3-methylbutyl acetate, ethyl caproate, hexyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, isopropyl 2-methylbutyrate, isoamyl 3-methylbutyrate, ethyl 2-methylpentanoate, propyl 2-methylpentanoate, butyl 2-methylpentanoate, allyl heptanoate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Typically, the exposure step uses i-line of wavelength 364 nm, KrF excimer laser of wavelength 248 nm, ArF excimer laser of wavelength 193 nm, EUV of wavelength 13.5 nm, or EB.

Advantageous Effects of Invention

The pattern forming process using the rinse solution is successful in forming fine feature size patterns while minimizing the occurrence of pattern collapse after development.

BRIEF DESCRIPTION OF DRAWINGS

FIG. 1(A) to FIG. 1(F) schematically illustrates steps of the pattern forming process of the invention.

DESCRIPTION OF THE PREFERRED EMBODIMENTS

As used herein, the notation ($C_n$-$C_m$) means a group containing from n to m carbon atoms per group. "Optional"

or "optionally" means that the subsequently described event or circumstance may or may not occur, and that the description includes instances where the event occurs and instances where it does not.

The abbreviations and acronyms have the following meaning.
EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator Rinse Solution The invention provides a rinse solution comprising (A) a heat/acid-decomposable polymer and (B) an organic solvent.

The heat/acid-decomposable polymer (A) is not particularly limited as long as the polymer can be decomposed (i.e., polymer main chain can be cleaved) by the action of heat and/or acid. Preferred is a polymer comprising recurring units having the formula (1) or (2).

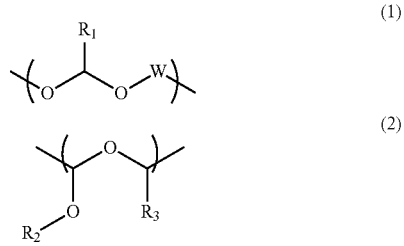

Herein $R^1$, $R^2$, and $R^3$ are each independently hydrogen or an optionally substituted, $C_1$-$C_{30}$ saturated or unsaturated, monovalent organic group, and W is a $C_2$-$C_{30}$ saturated or unsaturated, divalent organic group. As used herein, the term "organic group" refers to a group which contains at least one carbon atom and hydrogen atoms and may further contain a nitrogen, oxygen, sulfur, silicon, halogen atom(s) or the like.

The inclusion of a chain acetal structure in the recurring unit of formula (1) or (2) is effective for imparting appropriate heat decomposition and fluidity to the heat/acid-decomposable polymer (A). After heat or acid decomposition, the polymer is decomposed into lower molecular weight fractions which become gaseous due to high volatility. Thus no stresses are applied to the resist pattern, and pattern collapse is avoided.

Examples of the $C_1$-$C_{30}$ saturated or unsaturated, monovalent organic group include straight, branched or cyclic alkyl groups, halo-substituted alkyl groups, straight, branched or cyclic alkenyl groups, aryl groups, aralkyl groups, and heterocyclic groups, which may be substituted with one or more substituent radicals such as hydroxyl, $C_2$-$C_{10}$ alkyl, alkoxy, acyl, acyloxy, halogen, nitro or 1,1,1,3,3,3-hexafluoro-2-propanol radicals.

Suitable alkyl groups include methyl, ethyl, n-propyl, isopropyl, allyl, n-butyl, isobutyl, s-butyl, t-butyl, pentyl, cyclopentyl, hexyl, cyclohexyl, decyl, dodecyl, icosyl, triacontyl, norbornyl and adamantyl. Typical of the halo-substituted alkyl group is 2,2,2-trifluoroethyl. Suitable alkenyl groups include vinyl, 1-propenyl, isopropenyl, cyclohexenyl, and norbornenyl. Suitable aryl groups include phenyl, toluyl, xylyl, naphthyl, phenanthrenyl, anthracenyl, and fluorenyl. Suitable aralkyl groups include benzyl and naphthylmethyl. Suitable heterocyclic groups include 2-furanyl, 2-tetrahydrofuranyl, and pyridyl. Other suitable monovalent organic groups include hydroxyphenyl, $C_2$-$C_{10}$ alkyl-substituted phenyl, alkoxyphenyl, acylphenyl, acyloxyphenyl, halo-substituted phenyl, nitro-substituted phenyl, and 1,1,1,3,3,3-hexafluoro-2-propanol-substituted phenyl.

Inter alia, $R^1$, $R^2$, and $R^3$ are preferably hydrogen, methyl, ethyl, n-propyl, isopropyl, n-butyl, isobutyl, t-butyl, cyclopentyl, cyclohexyl, hydroxymethyl, and hydroxyethyl, with hydrogen, methyl, ethyl, n-propyl, and n-butyl being more preferred.

Examples of the $C_2$-$C_{30}$ saturated or unsaturated, divalent organic group include straight, branched or cyclic alkylene groups and arylene groups, which may be substituted with one or more substituent radicals such as hydroxyl, $C_2$-$C_{10}$ alkyl, alkoxy, acyl, acyloxy, halogen, nitro or 1,1,1,3,3,3-hexafluoro-2-propanol radicals.

Suitable alkylene groups include ethylene, propylene, butylene, trimethylene, tetramethylene, pentamethylene, hexamethylene, heptamethylene, octamethylene, decamethylene, dodecamethylene, icosamethylene, triacontamethylene, cyclopentanediyl, cyclohexanediyl, dimethylcyclohexanediyl, 2-butene-1,4-diyl, 2,4-hexadiene-1,6-diyl, 3-oxapentane-1,5-diyl, 3,6-dioxaoctane-1,8-diyl, 3,6,9-trioxaundecane-1,11-diyl, and adamantanediyl. Suitable arylene groups include phenylene, xylylene, naphthalenediyl, and dimethylnaphthalenediyl.

Inter alia, W is preferably ethylene, propylene, butylene, cyclohexanediyl, and ethyleneoxyethylene, with ethylene, propylene, butylene, and cyclohexanediyl being more preferred.

For the heat/acid-decomposable polymer comprising recurring units having an acetal structure, represented by formula (1) or (2), the recurring units may be of one type or a mixture of two or more types.

Examples of the recurring unit having an acetal structure, represented by formula (1), are shown below, but not limited thereto.

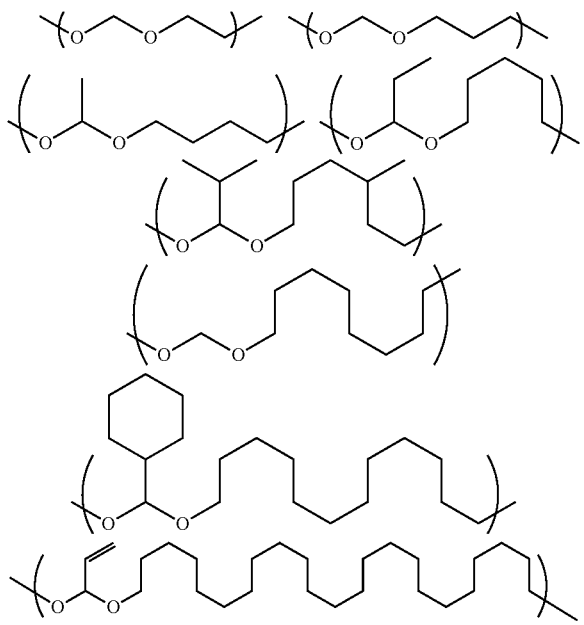

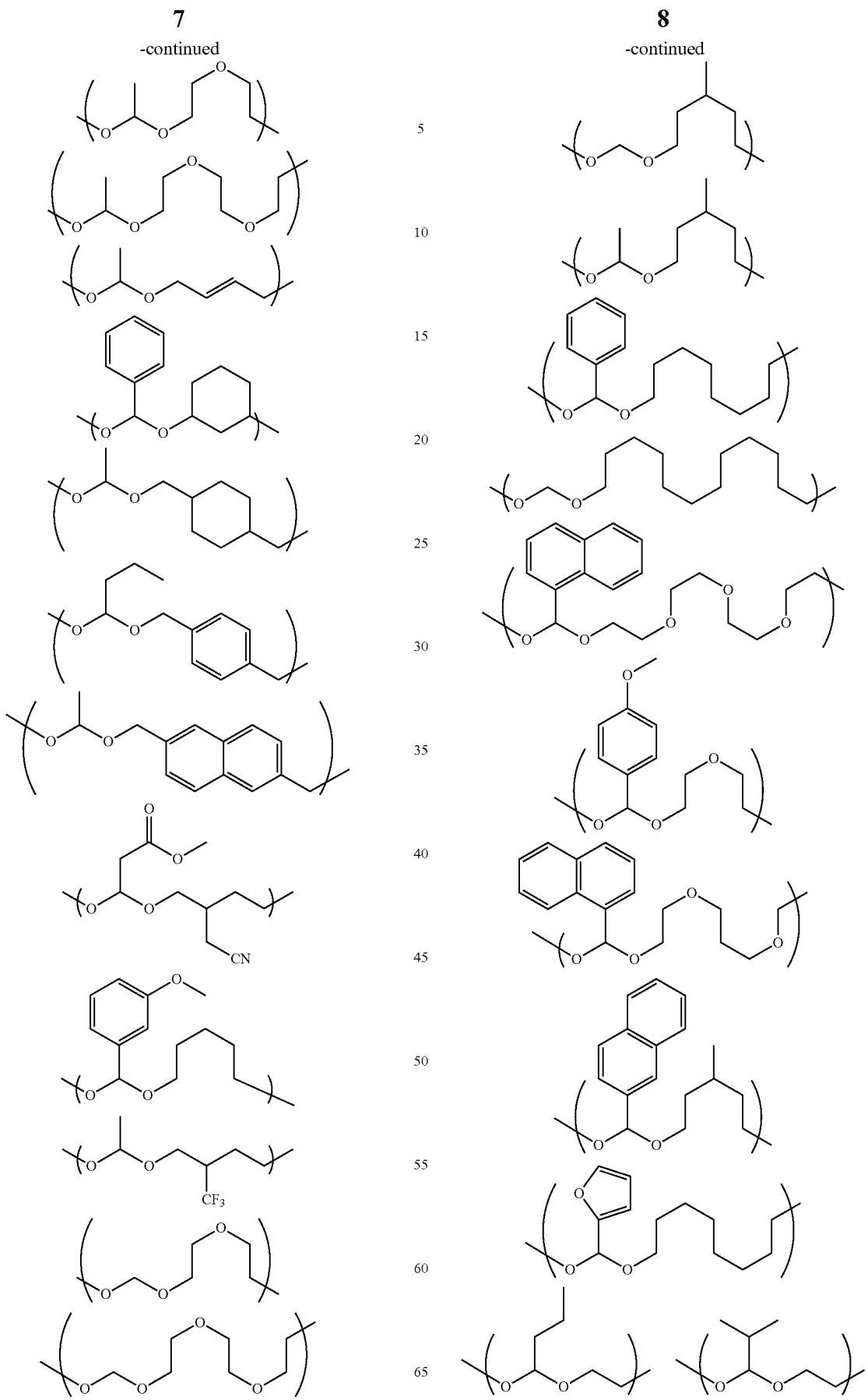

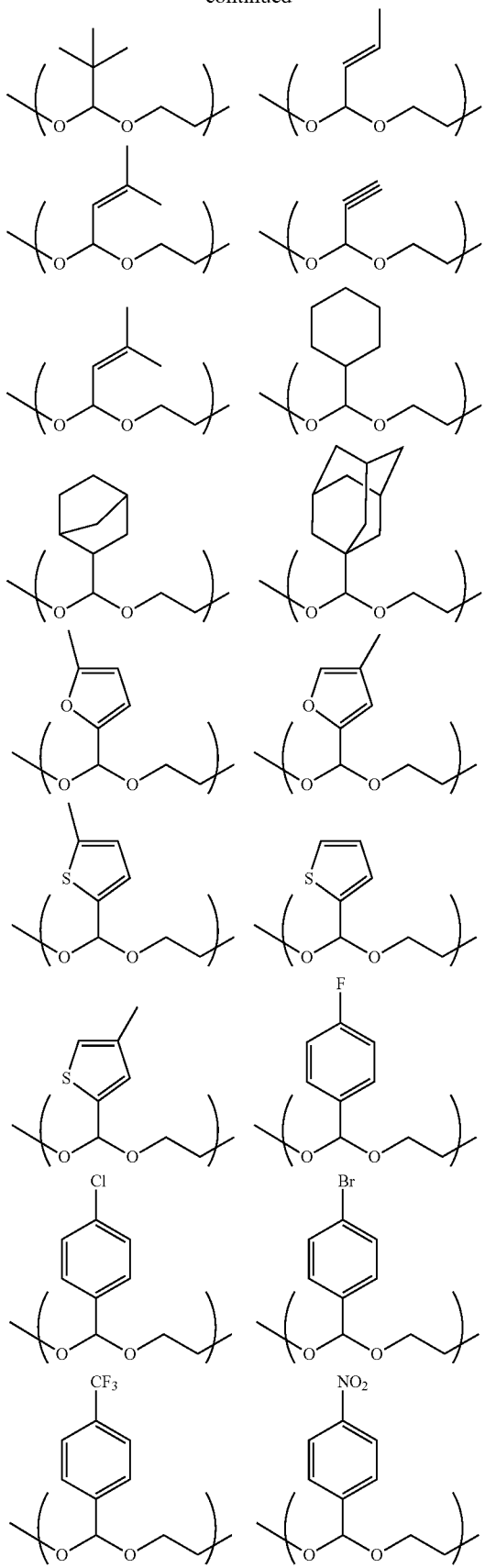

A heat/acid-decomposable polymer comprising recurring units of formula (1) may be prepared by an optimum method that is selected in accordance with the structure. For example, the following five methods are effective although the method is not limited thereto. The methods include reaction of a divinyl ether compound with a diol compound according to scheme (1)-a, reaction of a tertiary ether-substituted vinyl ether with a diol according to scheme (1)-b, reaction of a hydroxy-containing vinyl ether according to scheme (1)-c, reaction of an aldehyde compound with a diol compound according to scheme (1)-d, and reaction of an acetal compound with a diol compound according to scheme (1)-e, all in the presence of an acid catalyst.

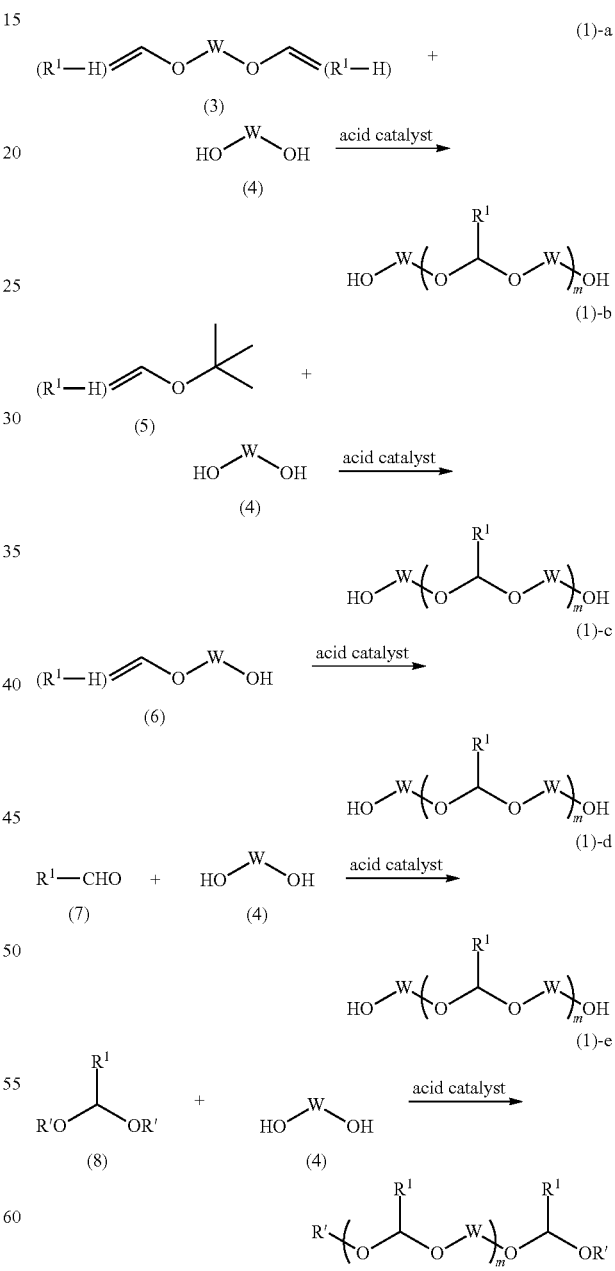

Herein $R^1$ is as defined above, ($R^1$—H) represents a group $R^1$ from which one hydrogen is eliminated, and m indicative of the degree of polymerization is preferably an integer of 3 to 2,000.

The foregoing reaction, when considered as elementary reaction, is a general acetal-forming reaction in the presence of an acid catalyst. This elementary reaction continues repeatedly to eventually form a polymer. In the reaction scheme (1)-a, the optimum amount of diol compound (4) relative to diether compound (3) is such that 0.5 to 2 moles, especially 0.8 to 1.2 moles of diol compound (4) may be present per mole of diether compound (3). In the reaction scheme (1)-b, the optimum amount of diol compound (4) relative to t-butyl ether compound (5) is such that 0.5 to 2 moles, especially 0.8 to 1.2 moles of diol compound (4) may be present per mole of t-butyl ether compound (5). The same applies to the optimum amount of diol compound (4) relative to aldehyde compound (7) in reaction scheme (1)-d, and the optimum amount of diol compound (4) relative to acetal compound (8) in reaction scheme (1)-e.

The acetal-forming reaction may be carried out by mixing reactants with an acid catalyst in a solvent or in a solventless system, and cooling or heating the system. If a solvent is used in the reaction, suitable solvents include aliphatic hydrocarbons such as hexane and heptane; aromatic hydrocarbons such as toluene, xylene, trimethylbenzene, and methylnaphthalene; ethers such as diethyl ether, dibutyl ether, diethylene glycol diethyl ether, diethylene glycol dimethyl ether, and tetrahydrofuran; ketones such as acetone and 2-butanone; alcohols such as t-butyl alcohol and t-amyl alcohol; esters such as ethyl acetate, propylene glycol monomethyl ether acetate (PGMEA), and γ-butyrolactone; nitriles such as acetonitrile; amides such as N,N-dimethylformamide and N,N-dimethylacetamide; and halogenated hydrocarbons such as o-dichlorobenzene, methylene chloride, and 1,2-dichloroethane, which may be used alone or in admixture.

Suitable acid catalysts include inorganic acids and organic acids. Suitable acidic catalysts include hydrochloric acid, nitric acid, sulfuric acid, formic acid, oxalic acid, acetic acid, methanesulfonic acid, camphorsulfonic acid, tosylic acid, trifluoromethanesulfonic acid, cation exchange resins, sodium hydrogensulfate, and pyridinium p-toluenesulfonate. The acid catalyst is preferably used in an amount of $1 \times 10^{-5}$ to $5 \times 10^{-1}$ mole per mole of the reactants combined.

The reaction temperature is preferably in the range of −100° C. to 100° C., more preferably −80° C. to 80° C. When a solvent is used, the reaction temperature is preferably below the boiling point of the solvent. A reaction temperature below −100° C. may delay the reaction whereas a reaction temperature above 100° C. may cause noticeable side reactions such as decomposition of the product. It is desirable from the yield standpoint to continue the reaction to completion while monitoring the reaction by thin layer chromatography (TLC), liquid chromatography (LC), gel permeation chromatography (GPC) although the reaction time is usually about 0.5 to about 200 hours. After the completion of reaction, the desired product or heat/acid-decomposable polymer may be recovered by ordinary aqueous work-up and/or filtration of insoluble.

Examples of the recurring unit having an acetal structure, represented by formula (2), are shown below, but not limited thereto.

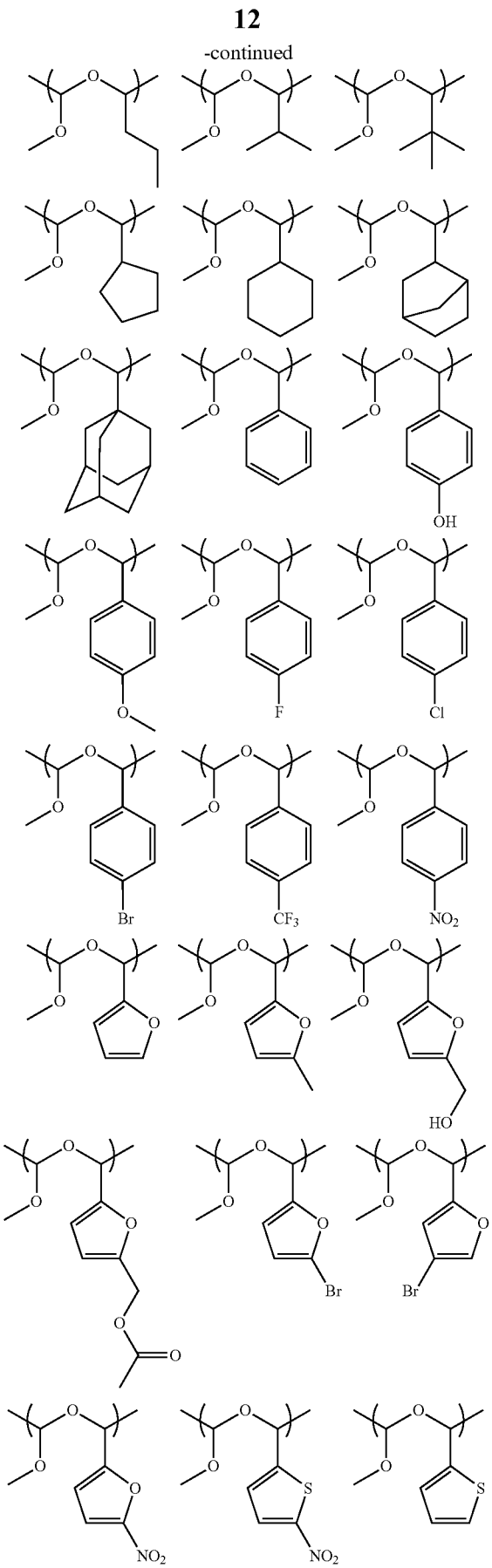

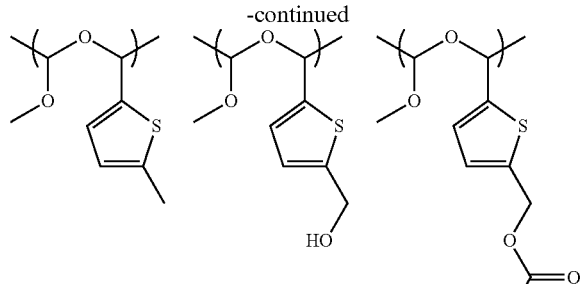
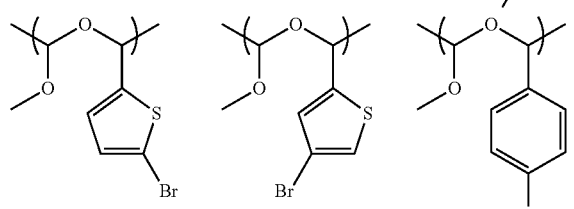
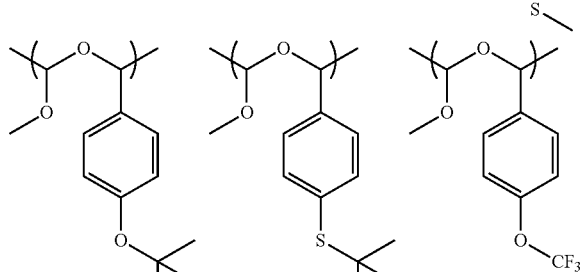
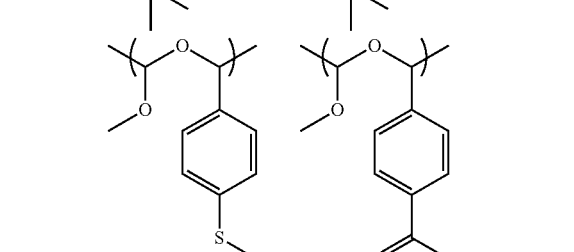
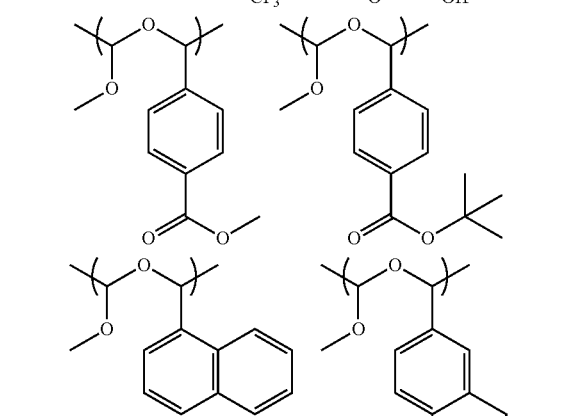
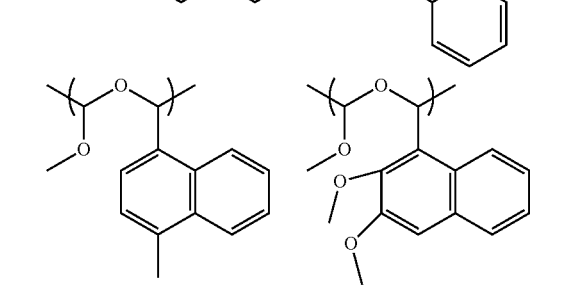
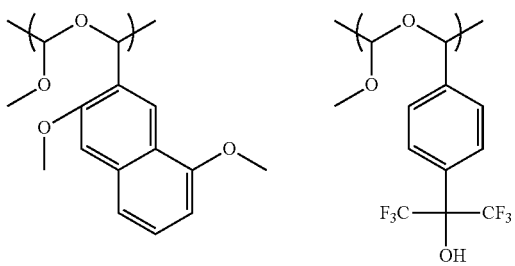
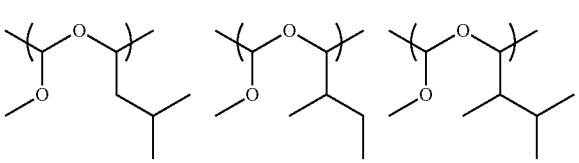
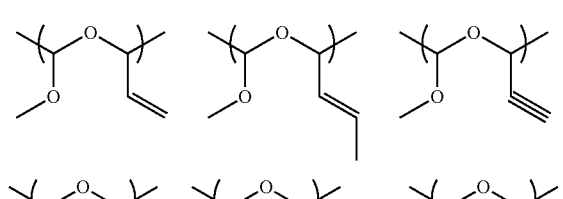
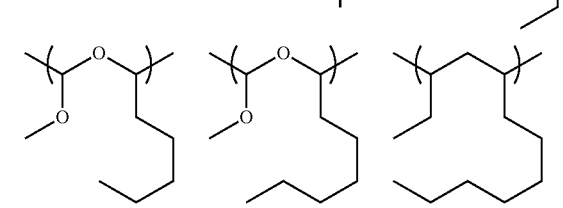
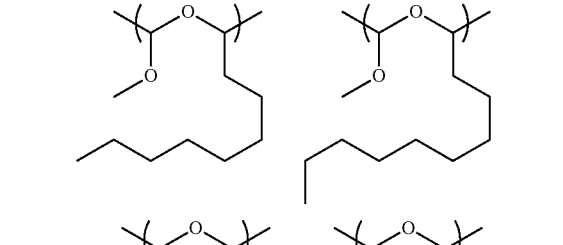
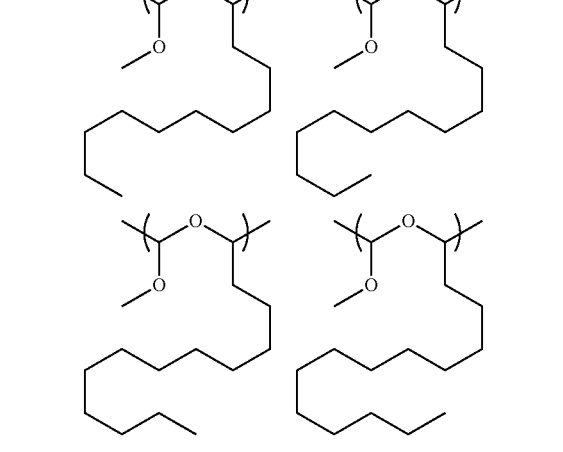

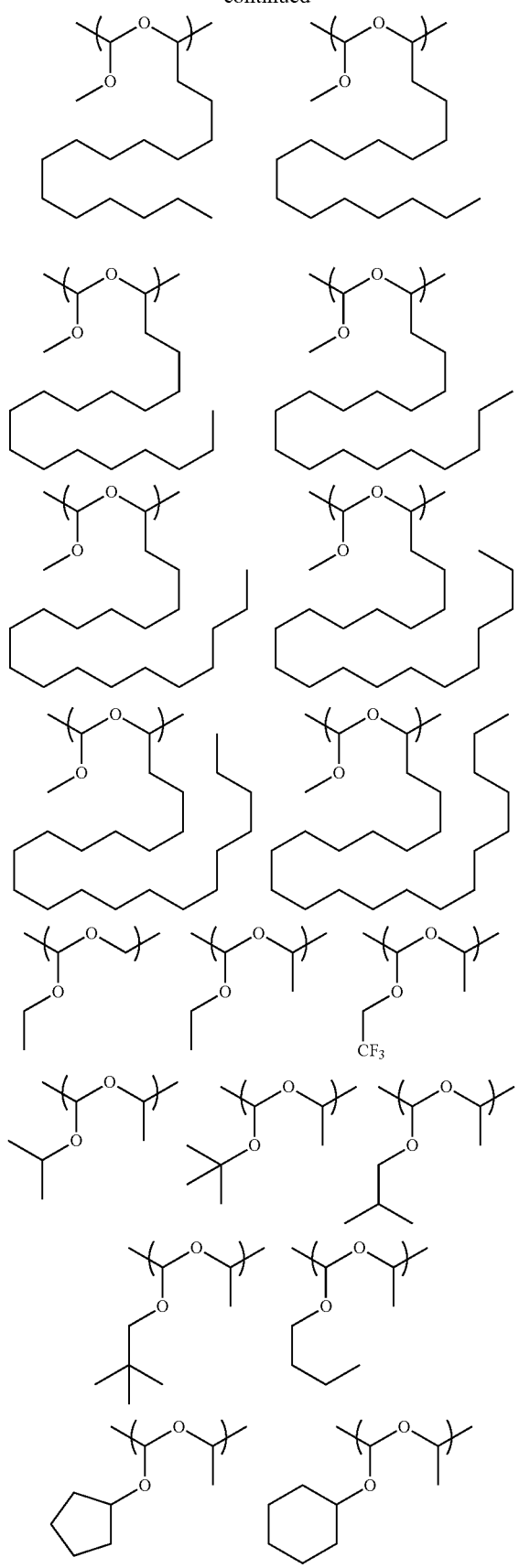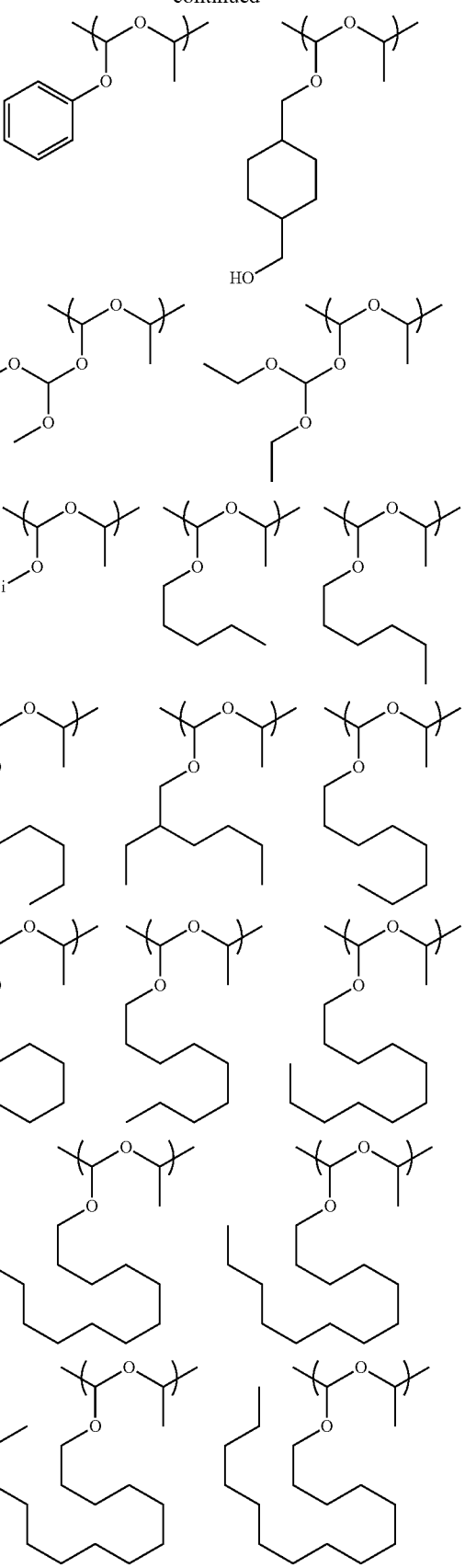

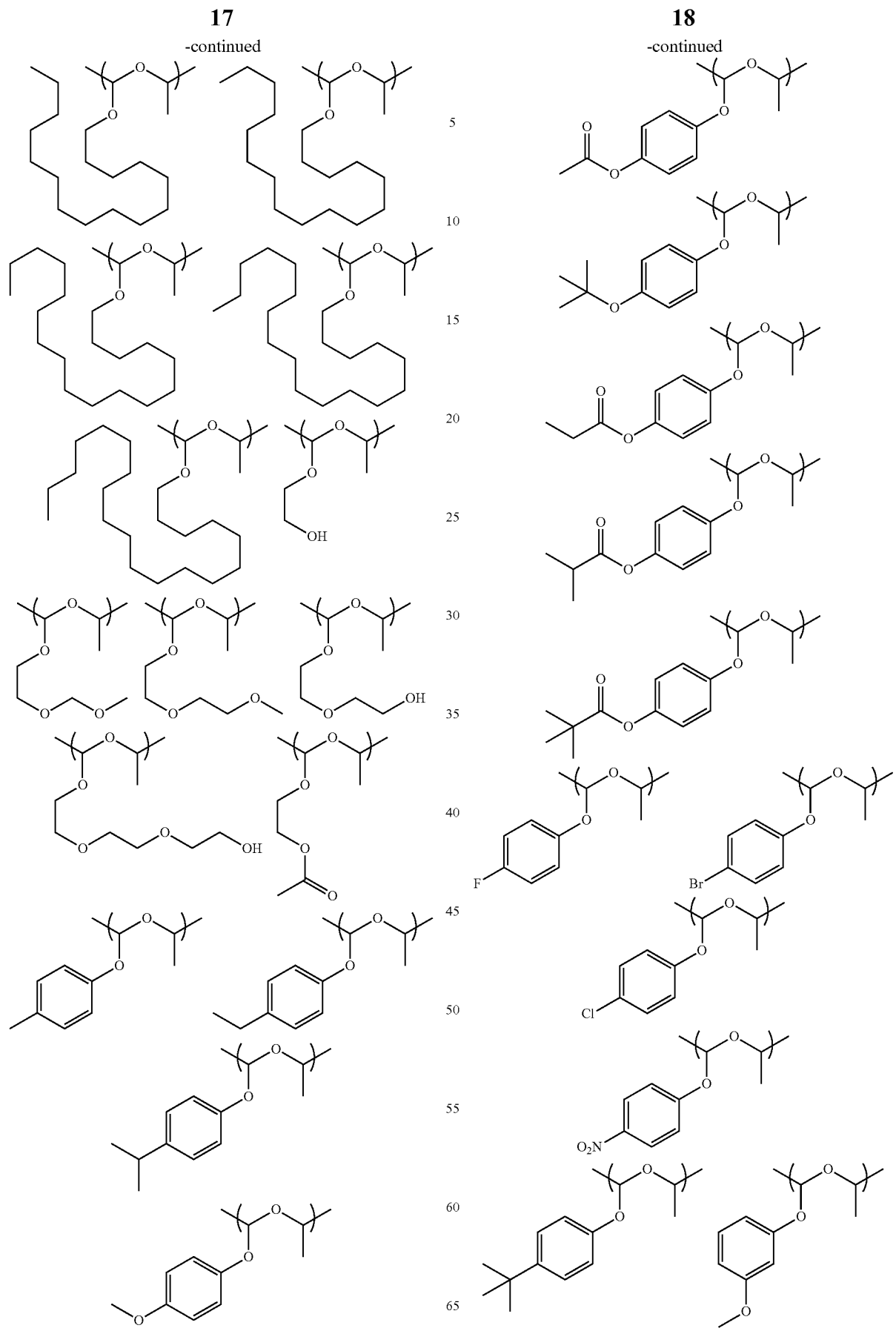

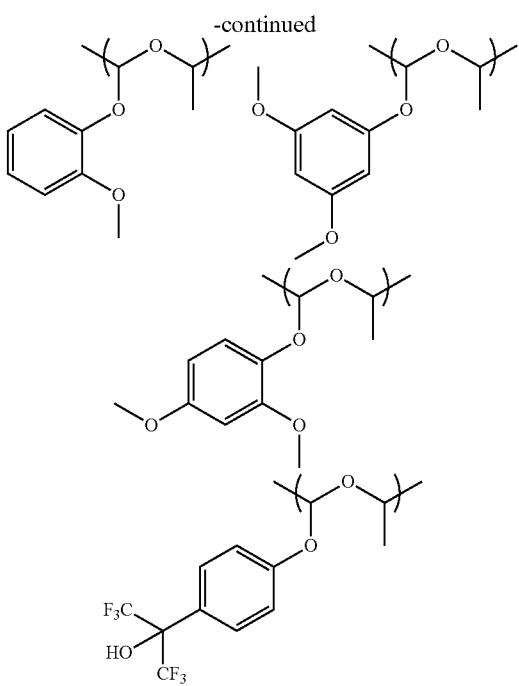

A heat/acid-decomposable polymer comprising recurring units of formula (2) may be prepared by reaction of a vinyl ether compound with an aldehyde compound according to the following reaction scheme (2)-a. For reaction conditions, reference may be made to JP-A 2012-211254.

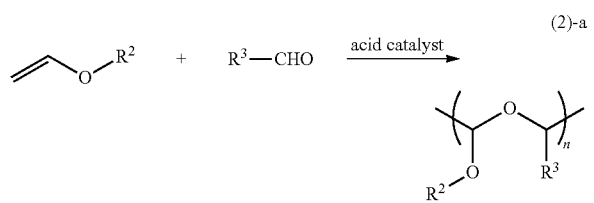

Herein $R^2$ and $R^3$ are as defined above, and n indicative of the degree of polymerization is preferably an integer of 3 to 2,000.

By a choice of $R^1$, $R^2$, $R^3$ and W, it is possible to adjust the characteristics of the heat/acid-decomposable polymer comprising recurring units of formula (1) or (2), including heat decomposition temperature, weight loss on heating, and fluidity and hence, the characteristics of organic film material.

The heat/acid-decomposable polymer (A) should preferably have a weight average molecular weight (Mw) of 300 to 200,000, more preferably 300 to 50,000, and even more preferably 500 to 40,000, as measured versus polystyrene standards by GPC using tetrahydrofuran solvent. The average number of recurring units, i.e., degree of polymerization is preferably 3 to 2,000, more preferably 3 to 500. If Mw is less than 300, the effect of the polymer may be lost due to volatilization or the like. If Mw exceeds 200,000, the polymer may lose flow and filling/flattening property.

If necessary, the heat/acid-decomposable polymer thus obtained may be purified by standard techniques such as separatory operation, crystallization, vacuum concentration, dialysis, and ultrafiltration. If necessary, the metal content may be reduced by passing the polymer through a commercially available demetallization filter.

The rinse solution of the invention also contains (B) an organic solvent which can dissolve the heat/acid-decomposable polymer (A), but not the resist film after development. The organic solvent (B) used herein is preferably selected from among $C_7$-$C_{10}$ ketone, $C_6$-$C_{12}$ ester, $C_7$-$C_{14}$ aldehyde, $C_6$-$C_{12}$ alkane, $C_6$-$C_{12}$ alkene, $C_6$-$C_{12}$ alkyne, $C_3$-$C_{10}$ alcohol, $C_8$-$C_{12}$ ether, and aromatic solvents.

Suitable $C_7$-$C_{10}$ ketone solvents include 2-octanone, 2-nonanone, 2-decanone, 2-heptanone, 3-heptanone, 4-heptanone, 2-hexanone, 3-hexanone, diisobutyl ketone, methylcyclohexanone, acetophenone, and methylacetophenone.

Suitable $C_6$-$C_{12}$ ester solvents include butyl acetate, isobutyl acetate, amyl acetate, isoamyl acetate, butenyl acetate, 2-methylbutyl acetate, 3-methylbutyl acetate, ethyl caproate, hexyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, isopropyl 2-methylbutyrate, isoamyl 3-methylbutyrate, ethyl 2-methylvalerate, ethyl 2-methylpentanoate, propyl 2-methylpentanoate, butyl 2-methylpentanoate, allyl heptanoate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Suitable $C_7$-$C_{14}$ aldehyde solvents include heptanal, octanal, nonanal, decanal, tetradecanal and benzaldehyde.

Suitable $C_6$-$C_{12}$ alkane solvents include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable $C_6$-$C_{12}$ alkene solvents include hexene, heptene, octene, cyclohexene, methylcyclohexene, dimethylcyclohexene, cycloheptene, and cyclooctene. Suitable $C_6$-$C_{12}$ alkyne solvents include hexyne, heptyne, and octyne.

Suitable $C_3$-$C_{10}$ alcohols include n-propyl alcohol, isopropyl alcohol, 1-butyl alcohol, 2-butyl alcohol, isobutyl alcohol, t-butyl alcohol, 1-pentanol, 2-pentanol, 3-pentanol, t-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Suitable $C_8$-$C_{12}$ ether solvents include di-n-butyl ether, diisobutyl ether, di-s-butyl ether, di-n-pentyl ether, diisopentyl ether, di-s-pentyl ether, di-t-amyl ether, and di-n-hexyl ether.

Suitable aromatic solvents include toluene, xylene, ethylbenzene, isopropylbenzene, t-butylbenzene, mesitylene, and anisole.

The organic solvents may be used alone or in admixture. An appropriate amount of the organic solvent (B) is 200 to 20,000 parts, more preferably 300 to 10,000 parts by weight per 100 parts by weight of the polymer (A).

The rinse solution may further comprise additives such as thermal acid generator, basic compound, surfactant and acetylene alcohol.

The thermal acid generator used herein is not particularly limited as long as it is thermally decomposed to generate an acid. Included are ammonium salts and sulfonium salts of organic acids such as sulfonic acids, carboxylic acids and imidic acids, and sulfonic acid esters. Exemplary acid generators are described in JP-A 2007-199653, paragraphs [0061]-[0085].

Also pyridinium salts of the following formula are preferred as the thermal acid generator.

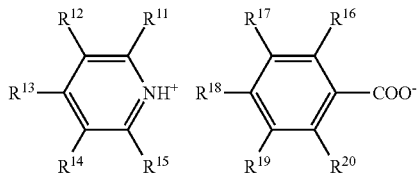

Herein $R^{11}$ to $R^{20}$ are each independently hydrogen, halogen, cyano, amino, a straight, branched or cyclic $C_1$-$C_{20}$ alkyl group or $C_6$-$C_{20}$ aryl group. Suitable alkyl and aryl groups are as described previously. The pyridinium salt may be readily synthesized by neutralizing reaction of a pyridine compound with a carboxylic acid.

As the basic compound, use may be made of the nitrogen-containing organic compounds described in JP-A 2008-111103, paragraphs [0146]-[0164] (U.S. Pat. No. 7,537,880), for example. Inter alia, primary, secondary and tertiary aliphatic amines, mixed amines, aromatic amines, and heterocyclic amines are preferred.

Specifically, suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Suitable mixed amines include dimethylethylamine, methylethylpropylamine, benzylamine, phenethylamine, and benzyldimethylamine.

Suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene.

Suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, dimethylaminopyridine, and fluoropyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Any surfactants which are commonly used for facilitating coating operation may be used herein. Preferred are nonionic surfactants including perfluoroalkyl polyoxyethylene ethanols, fluorinated alkyl esters, perfluoroalkylamine oxides, perfluoroalkyl EO adducts, and fluorinated organosiloxane compounds. These surfactants are commercially available under the trade name of Fluorad® FC-430 and FC-431 from 3M, Surflon® S-141, S-145, KH-10, KH-20, KH-30 and KH-40 from AGC Seimi Chemical Co., Ltd., Unidyne® DS-401, DS-403, and DS-451 from Daikin Industries, Ltd., Magaface® F-8151 from DIC Corp., and X-70-092 and X-70-093 from Shin-Etsu Chemical Co., Ltd. Inter alia, Fluorad FC-430, Surflon KH-20, KH-30, and X-70-093 are preferred.

As the acetylene alcohol, those described in JP-A 2008-111103, paragraphs [0190]-[0193] are useful.

The amount of the acid generator is preferably 0.0001 to 10 parts, more preferably 0.001 to 5 parts; the amount of the basic compound is preferably 0 to 100 parts, more preferably 0.001 to 50 parts; the amount of the surfactant is preferably 0 to 10 parts, more preferably 0.0001 to 5 parts; the amount of the acetylene alcohol is preferably 0.1 to 10 parts, more preferably 0.5 to 5 parts, when expressed in parts by weight per 100 parts by weight of the polymer (A).

Pattern Forming Process

Another embodiment is a pattern forming process comprising the steps of:

(1) forming a resist film on a substrate, the resist film comprising a resin having a solubility in a developer that changes under the action of acid, (2) exposing the resist film and baking, (3) developing the exposed resist film in an organic solvent developer, (4) replacing the developer by the rinse solution defined above, and (5) heating the solution on the resist film to decompose and eliminate the heat/acid-decomposable polymer.

The substrate used herein is generally a silicon substrate though not limited thereto. Substrates of materials different from a processable film, for example, substrates of Si, amorphous silicon (α-Si), p-Si, $SiO_2$, SiN, SiON, W, TiN, and Al are useful.

A processable film may be formed on the substrate. It may be composed of metals including silicon, gallium, titanium, tungsten, hafnium, zirconium, chromium, germanium, copper, aluminum, and iron, and alloys thereof. Examples of the processable film containing such metals include films of Si, $SiO_2$, SiN, SiON, SiOC, p-Si, α-Si, TiN, WSi, BPSG, SOG, Cr, CrO, CrON, MoSi, W, W—Si, Al, Cu, Al—Si, low dielectric films, and etch stop films, typically having a thickness of 50 to 10,000 nm, especially 100 to 5,000 nm.

An antireflective film or hard mask film may intervene between the resist film and the processable film. Especially preferred is a trilayer process involving forming an organic hydrocarbon film having a carbon content of at least 80% by weight on the processable film, forming a silicon-containing film having a silicon content of at least 15% by weight thereon, and forming a resist film thereon.

In the negative pattern forming process of the invention, the resist film is preferably formed of a chemical amplified resist composition. The resist composition is not particularly limited as long as a pattern can be formed via development using an organic solvent developer.

For example, when the exposure step is lithography using ArF excimer laser light, the resist film may be made of any well-known resist compositions for the ArF lithography.

For the ArF lithography, a number of resist compositions are well known. These well-known resins are generally classified into poly(meth)acrylic, COMA (cycloolefin-maleic anhydride), COMA-(meth)acrylic hybrid, ROMP (ring opening metathesis polymerization), and polynorbornene systems. Of these, resist compositions using poly(meth)acrylic resins are preferred because of superior resolution performance to other resin systems.

In negative pattern formation according to the trilayer process, a silicon-containing underlying film is formed before a resist film is formed thereon using a resist composition solution. A spin coating technique is preferably used in forming both the underlying film and the resist film. After the resist composition is spin coated, it is prebaked, preferably at a temperature of 80 to 180° C. for a time of 10 to 300 seconds to form a resist film. The resist film is exposed and developed in an organic solvent developer, forming a negative resist pattern. The exposure is preferably followed by bake (PEB).

The developer used herein is based on an organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, 2-methylbutyl acetate, 3-methylbutyl acetate, ethyl caproate, hexyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, isopropyl 2-methylbutyrate, isoamyl 3-methylbutyrate, ethyl 2-methyl-pentanoate, propyl 2-methylpentanoate, butyl 2-methylpentanoate, allyl heptanoate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, which may be used alone or in admixture. A developer containing at least 50% by weight of the aforementioned organic solvent is preferred from the standpoint of pattern collapse prevention. The developer solvent may be selected in accordance with the resist film used.

Referring to FIG. 1(A) to FIG. 1(F), one exemplary negative pattern forming process is described. In this process, a resist composition is applied onto a processable film 20 on a substrate 10 by any well-known technique, typically spin coating, to form a resist film 30, as shown in FIG. 1(A).

The resist film 30 is patternwise exposed at 40 to radiation from a light source of wavelength 10 to 400 nm (e.g., i-line of wavelength 365 nm, KrF excimer laser of 248 nm, ArF excimer laser of 193 nm, or EUV of 13.5 nm) through a mask or directly scan with EB, or in a combination thereof, as shown in FIG. 1(B). The resist film is baked (PEB) under conditions which are selected for a particular resist film, and developed in an organic solvent developer 50 as shown in FIG. 1(C). Development in the organic solvent developer causes the unexposed region of the resist film to be dissolved, yielding a negative tone resist pattern 30a.

In the pattern forming process of the invention, the developer is replaced by an inventive rinse solution 60 as shown in FIG. 1(D). Replacement of the developer may be performed directly by the rinse solution. Alternatively, once the developer is replaced by a polyacetal-free rinse liquid, the rinse liquid is replaced by the inventive rinse solution. The replacement mode is not particularly limited. For example, while the developer-carrying wafer is spun, the inventive rinse solution is dispensed onto the wafer at its center, thereby displacing the developer toward the wafer edge.

The polyacetal-free rinse liquid is preferably a solvent which is miscible with the organic solvent developer, but does not dissolve the resist film. This solvent is preferably selected from the same group as the organic solvent (B) in the rinse solution. More preferably, a choice is made of $C_3$-$C_{10}$ alcohol, $C_8$-$C_{12}$ ether, $C_6$-$C_{12}$ alkane, $C_6$-$C_{12}$ alkene, $C_6$-$C_{12}$ alkyne, and aromatic solvents. Examples of these solvents are as exemplified above.

When the polyacetal-containing rinse solution according to the invention is applied to the resist film, the polyacetal fills in between resist pattern features 30a. The rinse solution-carrying wafer is then baked. Since the polyacetal is liable to decompose with acid, the polyacetal main chain is cleaved by the acid having diffused from the resist film during the bake or the acid generated by the acid generator added to the polyacetal material during the bake, whereupon the decomposed products will evaporate as shown in FIG. 1(E). Since the normally solid polyacetal becomes gaseous and evaporate off at this point, no surface stresses are applied to the resist pattern. This prevents the resist pattern from collapse. With the resist pattern made mask, the processable film 20 is etched as shown in FIG. 1(F).

EXAMPLE

Examples of the invention are given below by way of illustration and not by way of limitation. Mw is measured versus polystyrene standards by GPC.

[1] Synthesis of Polymer (A)

Synthesis Example 1

Synthesis of Polymer 1
At room temperature, 100 g of diethylene glycol monovinyl ether was added to a mixture of 3.8 g of a cation exchange resin (Amberlyst® 15) and 100 g of ethyl acetate, followed by 3 hours of stirring. To the reaction solution, 0.8 g of triethylamine was added to quench the reaction. The cation exchange resin was filtered off. The filtrate was concentrated under reduced pressure, obtaining Polymer 1 as viscous liquid.
Polymer 1
  Mw=4,900
  Mw/Mn=2.33

Synthesis Example 2

Synthesis of Polymer 2
Reaction was carried out as in Synthesis Example 1 aside from using 129 g of 1,4-cyclohexane dimethanol instead of 100 g of diethylene glycol monovinyl ether. Polymer 2 was obtained as viscous liquid.
Polymer 2
  Mw=6,000
  Mw/Mn=2.57

Synthesis Example 3

Synthesis of Polymer 3
To 20 mL of toluene at −70° C., 3 g of 2-hydroxyvinyl ether, 4 g of benzaldehyde and 0.01 g of methanesulfonic acid were added, followed by 48 hours of reaction. To the reaction solution, 0.02 g of ammoniacal methanol was added to quench the reaction. The filtrate was concentrated under reduced pressure, obtaining Polymer 3.
Polymer 3
  Mw=5,400
  Mw/Mn=2.33

Synthesis Example 4

Synthesis of Resist Polymer 1
A 2-L flask was charged with 10.5 g of 3-t-butyl-3-cyclopentyl methacrylate, 2.5 g of 3-hydroxy-1-adamantyl methacrylate, 4.4 g of 3-ethyl-3-exo-tetracyclo[4.4.0.1$^{2,5}$.1$^{7,10}$]dodecanyl methacrylate, 3.4 g of tetrahydro-2-oxo-furan-3-yl methacrylate, and 40 g of tetrahydrofuran as solvent. In nitrogen atmosphere, this reactor was cooled to −70° C., whereupon vacuum pumping and nitrogen blow were repeated three times. The reactor was warmed up to room temperature, whereupon 1.2 g of azobisisobutyronitrile was added as polymerization initiator. The reaction solution was heated at 60° C. whereupon reaction run for 15 hours. The reaction solution was poured into 1 L of isopropyl alcohol for precipitation. The resulting white solid was filtered and dried in vacuum at 60° C., obtaining a white polymer. The polymer was analyzed by $^{13}$C-NMR and $^1$H-NMR spectroscopy and GPC, with the results shown below.

Copolymer Compositional Ratio (Molar Ratio)
3-t-butyl-3-cyclopentyl methacrylate:3-hydroxy-1-adamantyl methacrylate:3-ethyl-3-exo-tetracyclo[4.4.0.1$^{2,5}$.1$^{7,10}$]dodecanyl methacrylate:tetrahydro-2-oxofuran-3-yl methacrylate=0.50:0.10:0.20:0.20
Resist Polymer 1
  Mw=7,500
  Mw/Mn=1.61

Resist Polymer 1

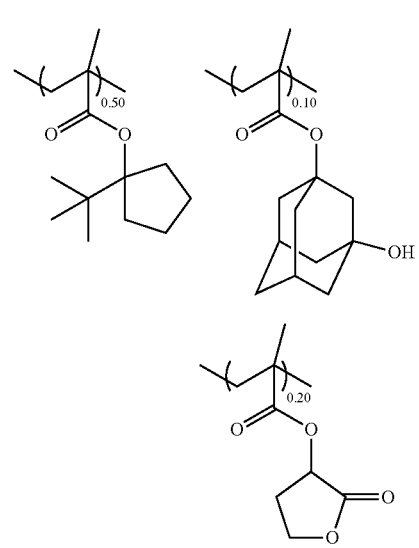

Synthesis Example 5

Synthesis of Water-Repellent Polymer 1

Water-repellent Polymer 1 was synthesized according to the method of JP-A 2008-111089.

Water-Repellent Polymer 1
  Mw=7,800
  Mw/Mn=1.55

Water-repellent Polymer 1

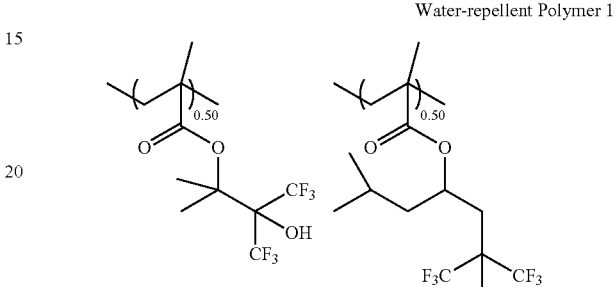

[2] Preparation of Rinse Solution

Rinse solutions were prepared by mixing Polymer 1, 2 or 3, thermal acid generator, and basic compound in a solvent according to the formulation shown in Table 1, and filtering through a Teflon® filter having a pore size of 0.2 μm.

TABLE 1

| Rinse solution | Polymer (pbw) | Acid generator (pbw) | Basic compound (pbw) | Organic solvent (pbw) |
|---|---|---|---|---|
| Rinse 1 | Polymer 1 (100) | — | — | 4-methyl-2-pentanol (6,000) |
| Rinse 2 | Polymer 2 (100) | — | — | 4-methyl-2-pentanol (5,000) diisopentyl ether (1,000) |
| Rinse 3 | Polymer 3 (100) | — | — | 4-methyl-2-pentanol (5,000) anisole (1,000) |
| Rinse 4 | Polymer 3 (100) | — | 4-fluoropyridine (5) | 4-methyl-2-pentanol (5,000) anisole (1,000) |
| Rinse 5 | Polymer 1 (100) | TAG1 (0.1) | — | 4-methyl-2-pentanol (6,000) |
| Rinse 6 | Polymer 3 (100) | — | — | isopropyl 2-methylbutyrate (6,000) |
| Rinse 7 | Polymer 1 (100) | — | — | 4-methyl-2-pentanol (4,000) ethyl 2-methylvalerate (2,000) |
| Rinse 8 | Polymer 1 (100) | — | — | 4-methyl-2-pentanol (6,000) 4-heptanone (2,000) |
| Rinse 9 | Polymer 1 (100) | — | pyridine (5) | 4-methyl-2-pentanol (6,000) 4-heptanone (2,000) |
| Rinse 10 | Polymer 1 (100) | — | triethylamine (2) | 4-methyl-2-pentanol (6,000) 4-heptanone (2,000) |
| Rinse 11 | Polymer 1 (100) | — | isooxazole (3) | 4-methyl-2-pentanol (6,000) 4-heptanone (2,000) |
| Rinse 12 | Polymer 1 (100) | — | n-butylamine (2) | 4-methyl-2-pentanol (6,000) 4-heptanone (2,000) |
| Rinse 13 | Polymer 1 (100) | — | aniline (2) | 4-methyl-2-pentanol (6,000) 4-heptanone (2,000) |
| Rinse 14 | Polymer 1 (100) | — | morpholine (2) | 4-methyl-2-pentanol (6,000) 4-heptanone (2,000) |
| Rinse 15 | Polymer 1 (100) | — | piperidine (1) | 4-methyl-2-pentanol (6,000) 4-heptanone (2,000) |

In Table 1, TAG1 is the thermal acid generator identified below.
TAG1

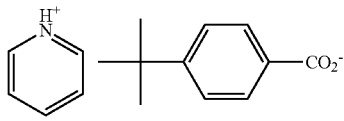

TAG 1

[3] Preparation of Resist Composition

A resist composition was prepared by mixing Resist Polymer 1 and ingredients in a solvent containing 100 ppm of surfactant FC-4430 (3M) according to the formulation shown in Table 2, and filtering through a filter having a pore size of 0.2 μm.

TABLE 2

| Resist | Polymer (pbw) | Acid generator (pbw) | Quencher (pbw) | Water repellent (pbw) | Organic solvent (pbw) |
|---|---|---|---|---|---|
| Resist 1 | Resist Polymer 1 (100) | PAG1 (5.0) | Sulfonium salt 1 (5.0) | Water-repellent Polymer 1 (3.0) | PGMEA (2,500) γ-butyrolactone (200) |

*PGMEA: propylene glycol monomethyl ether acetate

In Table 2, PAG1 and Sulfonium salt 1 are identified below.
Acid Generator: PAG1

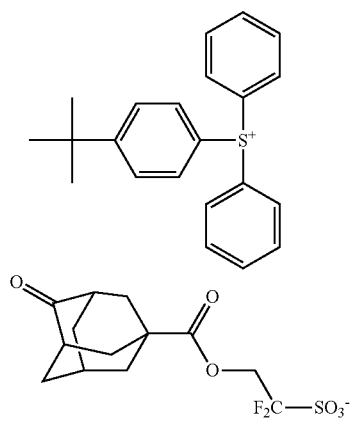

PAG 1

Sulfonium Salt 1

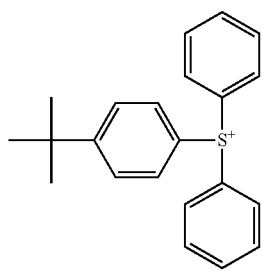

Sulfonium salt 1

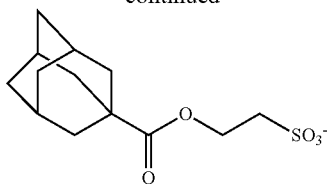

[4] ArF Lithography Patterning Test

Examples 1 to 17 & Comparative Examples 1, 2

On a silicon wafer, a spin-on carbon film ODL-102 (Shin-Etsu Chemical Co., Ltd.) was deposited to a thickness of 200 nm and a silicon-containing spin-on hard mask SHB-A940 was deposited thereon to a thickness of 35 nm. On this substrate for trilayer process, the resist composition was spin coated, then baked on a hot plate at 100° C. for 60 seconds to form a resist film of 100 nm thick. Using an ArF excimer laser immersion lithography scanner NSR-610C (Nikon Corp., NA 1.30, σ0.98/0.78, dipole opening 20 deg., azimuthally polarized illumination), the resist film was exposed through a 6% halftone phase shift mask having a 1:1 line-and-space pattern with an on-wafer size of 40 nm while varying the exposure dose. After the exposure, the resist film was baked (PEB) at 90° C. for 60 seconds and puddle developed in n-butyl acetate for 30 seconds. Thereafter, the polymer-containing rinse solution shown in Table 1 was applied thereon until the spaces between negative pattern features were filled with the polymer in the rinse solution. This was baked at the temperature shown in Table 3 for 60 seconds for letting the polymer evaporate off, yielding a negative pattern.

In Comparative Example 1, the puddle development in n-butyl acetate for 30 seconds was followed by spin drying for removing the developer. In Comparative Example 2, after the puddle development in n-butyl acetate for 30 seconds, the resist film was rinsed with 4-methyl-2-pentanol, spin dried and baked at 100° C. for 60 seconds for evaporating off the rinse liquid.

After evaporation of the rinse solution, the line-and-space pattern was observed under a CD-SEM (CG-4000 by Hitachi, Ltd.) to measure the minimum line width at pitch 80 nm, with the results shown in Table 3.

TABLE 3

| | Resist | Rinse solution | Bake temp. (° C.) | Minimum size (nm) |
|---|---|---|---|---|
| Example 1 | Resist 1 | Rinse 1 | 120 | 15 |
| Example 2 | Resist 1 | Rinse 1 | 120 | 16 |
| Example 3 | Resist 1 | Rinse 2 | 120 | 17 |
| Example 4 | Resist 1 | Rinse 3 | 130 | 16 |
| Example 5 | Resist 1 | Rinse 4 | 130 | 16 |
| Example 6 | Resist 1 | Rinse 5 | 120 | 15 |
| Example 7 | Resist 1 | Rinse 6 | 120 | 14 |
| Example 8 | Resist 1 | Rinse 7 | 120 | 19 |
| Example 9 | Resist 1 | Rinse 8 | 110 | 16 |
| Example 10 | Resist 1 | 4-methyl-2-pentanol + Rinse 1 | 120 | 18 |
| Example 11 | Resist 1 | Rinse 9 | 130 | 17 |
| Example 12 | Resist 1 | Rinse 10 | 130 | 16 |
| Example 13 | Resist 1 | Rinse 11 | 130 | 14 |
| Example 14 | Resist 1 | Rinse 12 | 130 | 13 |
| Example 15 | Resist 1 | Rinse 13 | 130 | 14 |
| Example 16 | Resist 1 | Rinse 14 | 130 | 15 |

TABLE 3-continued

| | Resist | Rinse solution | Bake temp. (° C.) | Minimum size (nm) |
|---|---|---|---|---|
| Example 17 | Resist 1 | Rinse 15 | 130 | 14 |
| Comparative Example 1 | Resist 1 | — | — | 48 |
| Comparative Example 2 | Resist 1 | 4-methyl-2-pentanol | 100 | 49 |

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2014-239498 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A rinse solution for pattern formation comprising (A) a heat/acid-decomposable polymer, (B) an organic solvent, and a thermal acid generator,
wherein the heat/acid-decomposable polymer comprises recurring units having the formula (1) or (2):

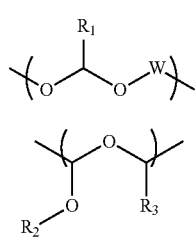

wherein $R^1$, $R^2$, and $R^3$ are each independently hydrogen or an optionally substituted, $C_1$-$C_{30}$ saturated or unsaturated, monovalent organic group, and W is a $C_2$-$C_{30}$ saturated or unsaturated, divalent organic group.

2. The rinse solution of claim 1 wherein the organic solvent (B) is at least one solvent selected from the group consisting of $C_7$-$C_{10}$ ketone, $C_6$-$C_{12}$ ester, $C_7$-$C_{14}$ aldehyde, $C_6$-$C_{12}$ alkane, $C_6$-$C_{12}$ alkene, $C_6$-$C_{12}$ alkyne, $C_3$-$C_{10}$ alcohol, $C_8$-$C_{12}$ ether, and aromatic solvents.

3. The rinse solution of claim 2 wherein the organic solvent (B) is at least one solvent selected from the group consisting of 2-octanone, 2-nonanone, 2-decanone, 2-heptanone, 3-heptanone, 4-heptanone, 2-hexanone, 3-hexanone, diisobutyl ketone, methylcyclohexanone, acetophenone, methylacetophenone, butyl acetate, isobutyl acetate, amyl acetate, isoamyl acetate, butenyl acetate, 2-methylbutyl acetate, 3-methylbutyl acetate, ethyl caproate, hexyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, isopropyl 2-methylbutyrate, isoamyl 3-methylbutyrate, ethyl 2-methylvalerate, ethyl 2-methylpentanoate, propyl 2-methylpentanoate, butyl 2-methylpentanoate, allyl heptanoate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, hexane, heptane, octane, nonane, decane, undecane, dodecane, methylcyclopentane, dimethylcyclopentane, cyclohexane, methylcyclohexane, dimethylcyclohexane, cycloheptane, cyclooctane, cyclononane, hexene, heptene, octene, cyclohexene, methylcyclohexene, dimethylcyclohexene, cycloheptene, cyclooctene, hexyne, heptyne, octyne, n-propyl alcohol, isopropyl alcohol, 1-butyl alcohol, 2-butyl alcohol, isobutyl alcohol, t-butyl alcohol, 1-pentanol, 2-pentanol, 3-pentanol, t-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, di-n-butyl ether, diisobutyl ether, di-s-butyl ether, di-n-pentyl ether, diisopentyl ether, di-s-pentyl ether, di-t-amyl ether, di-n-hexyl ether, toluene, xylene, ethylbenzene, isopropylbenzene, t-butylbenzene, mesitylene, and anisole.

4. The rinse solution of claim 1 wherein the thermal acid generator is an ammonium or sulfonium salt of an organic acid selected from sulfonic acid, carboxylic acid and imidic acid, a sulfonic acid ester, or a pyridinium salt having the following formula:

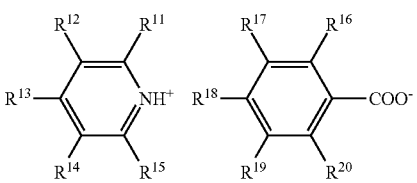

wherein $R^{11}$ to $R^{20}$ are each independently hydrogen, halogen, cyano, amino, a straight, branched or cyclic $C_1$-$C_{20}$ alkyl group, or $C_6$-$C_{20}$ aryl group.

5. The rinse solution of claim 1, further comprising a basic compound.

6. The rinse solution of claim 1 wherein the heat/acid decomposable polymer comprises recurring units having the formula (1).

7. The rinse solution of claim 1 wherein the heat/acid decomposable polymer comprises recurring units having the formula (2).

8. A pattern forming process comprising the steps of:
(1) forming a resist film on a substrate, the resist film comprising a resin having a solubility in a developer that changes under the action of acid,
(2) exposing the resist film and baking,
(3) developing the exposed resist film in an organic solvent developer, (4) replacing the developer by a rinse solution comprising (A) a heat/acid-decomposable polymer and (B) an organic solvent, and
(5) heating the solution on the resist film to decompose and eliminate the heat/acid-decomposable polymer.

9. The pattern forming process of claim 8 wherein the developer consists of at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, 2-methylbutyl acetate, 3-methylbutyl acetate, ethyl caproate, hexyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, isopropyl 2-methylbutyrate, isoamyl 3-methylbutyrate, ethyl 2-methylpentanoate, propyl 2-methylpentanoate, butyl 2-methylpentanoate, allyl heptanoate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

10. The pattern forming process of claim 8 wherein the exposure step uses i-line of wavelength 364 nm, KrF excimer laser of wavelength 248 nm, ArF excimer laser of wavelength 193 nm, EUV of wavelength 13.5 nm, or EB.

* * * * *